United States Patent [19]

Bauerschmidt

[11] Patent Number: 4,523,151

[45] Date of Patent: Jun. 11, 1985

[54] LINEARIZED PHASE LOCK LOOP FM-DEMODULATOR

[75] Inventor: Werner Bauerschmidt, Zirndorf, Fed. Rep. of Germany

[73] Assignee: Grundig E. M. V., Fed. Rep. of Germany

[21] Appl. No.: 359,925

[22] Filed: Mar. 19, 1982

[30] Foreign Application Priority Data

Apr. 10, 1981 [DE] Fed. Rep. of Germany ........ 3114595

[51] Int. Cl.³ .............................................. H03L 7/00
[52] U.S. Cl. ..................................... 329/124; 329/50; 331/23; 331/36 C
[58] Field of Search .......................... 329/50, 122, 124; 331/17, 23, 36 C, 177 V; 455/214, 337

[56] References Cited

U.S. PATENT DOCUMENTS

| | | | |
|---|---|---|---|
| 3,495,184 | 2/1970 | Perkins, Jr. et al. | 331/25 |
| 4,096,452 | 6/1978 | Waku et al. | 331/177 V X |
| 4,360,790 | 11/1982 | Heise | 331/36 C X |
| 4,367,542 | 1/1983 | DuBroff | 329/122 X |
| 4,387,348 | 6/1983 | Fritze | 331/17 |

Primary Examiner—Eugene R. LaRoche
Assistant Examiner—Robert J. Pascal
Attorney, Agent, or Firm—Kane, Dalsimer, Kane, Sullivan & Kurucz

[57] ABSTRACT

A circuit for minimizing non-linearity of an FM-demodulator which is in the form of a phase control circuit whereby its voltage controlled oscillator is controlled by adjusting the voltage applied to a capacitive diode coupled thereto so as to adjust the zero-axis crossing of the demodulator to coincide with the center frequency of the input signal to be demodulated.

4 Claims, 1 Drawing Figure

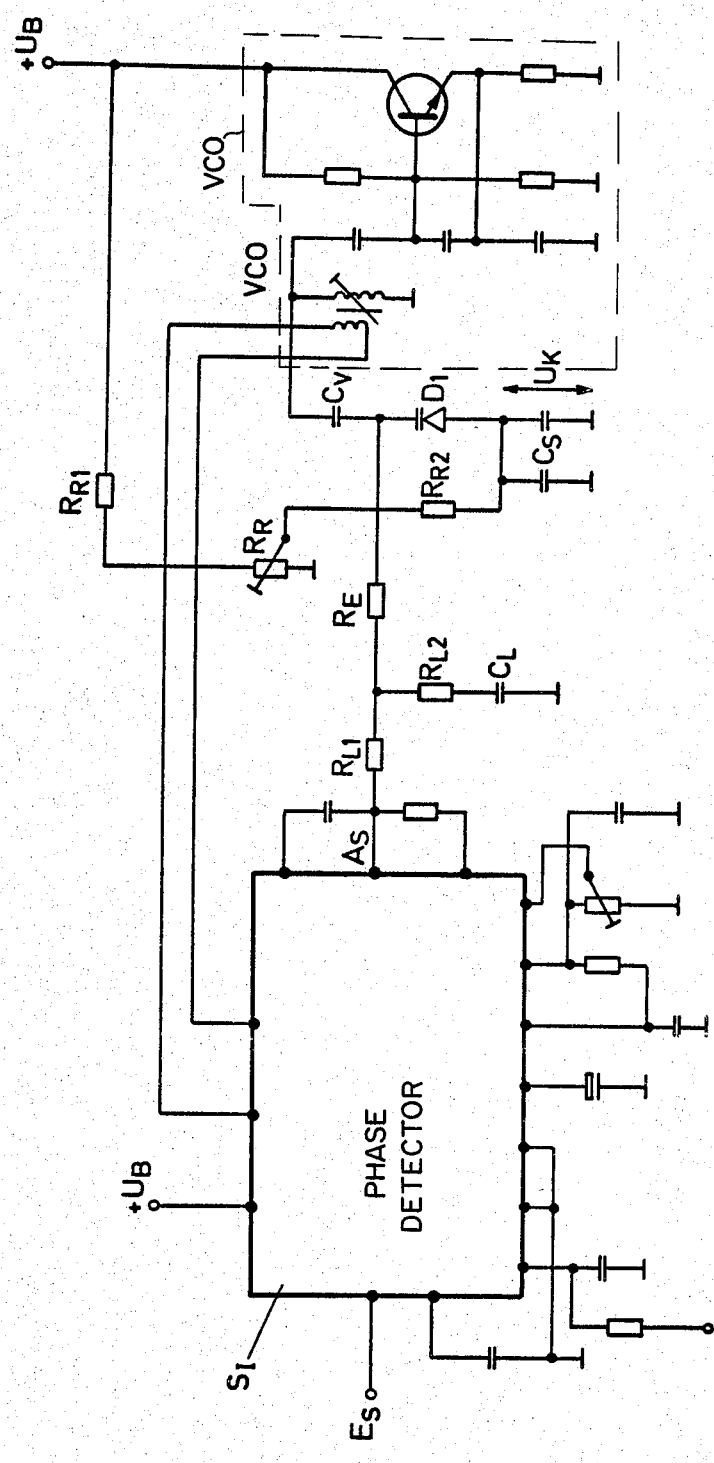

LINEARIZED PHASE LOCK LOOP FM-DEMODULATOR

FIELD OF THE INVENTION

The invention relates to an FM-demodulator utilizing an adjustable phase-lock-loop circuit.

BACKGROUND OF THE INVENTION

The demodulation of FM-signals with the assistance of quadrature demodulators is known. Briefly, this usually involves having an input signal fed at one time directly to the input of a multiplier and at the same time through a phase shifter circuit (LC-circuit). The phase difference of the signals generated therewith results in a proportional output voltage. This voltage corresponds to the modulated signal as compared to the carrier signal. Accordingly, a considerable alignment of the signals is necessary to obtain a minimum of distortion and to have the zero-axis-crossing of the output voltage in center frequencies.

In this regard, the use of a phase locked frequency analysis circuit utilizing phase control circuit or phase locked loop (PLL) has advantages. An FM-demodulator incorporating the PLL circuit usually consists of a multiplier, low pass filter and a voltage controlled oscillator (VCO). The multiplier and the low pass filter form a phase detector whose output voltage is a voltage corresponding to the momentary phase difference between oscillator signal and the input or modulated signal. With this voltage, the momentary phase of the oscillator signal is readjusted to the momentary phase of the input signal. When the momentary phases of both signals are synchronized, the loop is "locked".

When a linear condition exists between the control voltage, which is equal to the output voltage of the multiplier, and the frequency of the VCO, the control voltage becomes an image of the input signal and represents the demodulated signal. However the "VCO" has a linear voltage-frequency-characteristic-curve and it is difficult to obtain a frequency range in an intermediary frequency (for example, at 10. MHz) in a simple manner without linearization members.

SUMMARY OF THE INVENTION

Accordingly it is an object of the invention to provide a circuit for an FM-demodulator which provides the basic quality criteria of a demodulator with a simple and inexpensive circuit.

In this regard, the present invention utilizes a standard voltage controlled oscillator, VCO, which is controlled by way of a capacitive or varactor diode and has a non-linear voltage frequency characteristic curve without any specific measures. However, a capacitor is provided in series with the capacitive diode whereby its capacitance is reduced which results in a stretching of the voltage-frequency-characteristic-curve of the oscillator. Since the curve path of the characteristic curve is shifted by varying the oscillation inductivity, a point with the lowest non-linearity is obtained, i.e., a minimum distortion factor in the total demodulator circuit.

Generally, an output voltage is present at the input of the phase detector which is different from zero at a center frequency. However, since the zero-axis-crossing of the voltage is a very important criteria in center frequencies for tuning, i.e., FM-radios, etc., the circuit advantageously equalizes the generated faulty voltage. In this regard, there is provided at the anode of a capacitive diode a voltage which is adjustable such that a zero voltage is obtained at the detector output at an input in the center frequency. Thus the circuit allows for the resulting zero-axis-crossing of the demodulator characteristic curve which advantageously coincides with the center frequency of the signal to be demodulated providing basic quality criteria of the FM-demodulator at a low cost.

BRIEF DESCRIPTION OF THE DRAWING

Thus the aforenoted objects and advantages are realized by the present invention the description of which should be taken in conjunction with the drawing wherein:

The drawing is a schematic representation of an FM-demodulator incorporating the teachings of the present invention.

DETAILED DESCRIPTION OF THE DRAWING

Turning now to the drawing, an integrated circuit $S_I$ is shown which consists of a limit amplifier and a phase detector into which is fed an input signal $E_S$. The output signal As of the phase detector of the circuit $S_I$ is fed through a filter comprising resistors and capacitor $C_L$, $R_{L1}$, $R_{L2}$. Resistor $R_E$ connects to the filter and the connecting point between a capacitive or varactor diode $D_1$ and a capacitor $C_v$ and serves as a decoupler therebetween. Diode $D_1$ is used as a tuning diode with capacitor $C_v$ provided to change the capacitance of the diode $D_1$.

An adjustable voltage $U_K$ is placed on the anode of the diode $D_1$ by means of a variable resistor $R_R$. The variable resistor $R_R$ is coupled with a source voltage via resistor $R_{R1}$ and grounded. The adjustable voltage $U_K$ is fed through a center tap or through a pickoff resistor $R_{R2}$ to the diode $D_1$ with the anode of the diode $D_1$ grounded via at least one filter capacitor $C_S$.

As is readily apparent, by such an arrangement, the voltage $U_K$ at the anode of diode $D_1$ is adjustable by a variation of the resistor $R_R$ which will allow a zero voltage at the detector output resulting in the zero-axis-crossing of the demodulator characteristic curve coinciding with the center frequency of the signal being demodulated thereby allowing for an efficient yet economical demodulating circuit.

Thus by the aforenoted invention, the objects and advantages of the invention are realized, and although a preferred embodiment has been disclosed and described in detail herein, its scope should not be limited thereby, rather its scope should be determined in accordance with the pending claims.

What is claimed is:

1. A circuit for minimizing the nonlinearity in the zero-axis crossing of a phaselocked loop of an FM-demodulator including:
    a phase detector which receives an input signal and produces an output signal corresponding to the phase of said input signal and a center frequency;
    a circuit means for producing a circuit output signal in accordance with said phase detector output signal, said circuit means being adjustable to control the zero crossing linearity of the phase detector by producing a zero voltage level output signal when said input signal is at the center frequency of said phase detector;

a voltage controlled oscillator coupled between said circuit means and said phase detector to regulate said phase detector output; and wherein said circuit means includes a filter means coupled to the output of the phase detector; capacitor means coupled between the voltage controlled oscillator and an element with variable capacitance; decoupler means for coupling the output to said element; and an adjustment means connected to the element to vary the voltage at the element and correspondingly allow for a zero voltage output from the phase detector at the center frequency of a signal being demodulated.

2. The circuit in accordance with claim 1 wherein said filter means includes an RC filter; the element includes a capacitive diode; and the adjustment means includes a variable resistor coupled between a voltage source and the anode of the capacitive diode, the cathode of which is coupled to the capacitor means and decoupler means.

3. The circuit in accordance with claim 2 wherein the variable resistor is coupled on one hand with a voltage source and on the other hand to ground, having a center tap or pickoff means connected to the anode of the capacitive diode.

4. The circuit in accordance with claims 1, 3 or 4 which includes at least one filter capacitor coupled between ground and the capacitive diode.

* * * * *

UNITED STATES PATENT AND TRADEMARK OFFICE
CERTIFICATE OF CORRECTION

PATENT NO. : 4,523,151

DATED : June 11, 1985

INVENTOR(S) : Werner Bauerschmidt

It is certified that error appears in the above-identified patent and that said Letters Patent is hereby corrected as shown below:

Column 4, Line 11, "3 or 4" should read --2 or 3--.

Signed and Sealed this

Twenty-ninth Day of October 1985

[SEAL]

Attest:

DONALD J. QUIGG

Attesting Officer

Commissioner of Patents and
Trademarks—Designate